United States Patent
Wu et al.

(10) Patent No.: US 8,058,106 B2
(45) Date of Patent: Nov. 15, 2011

(54) MEMS DEVICE PACKAGE WITH VACUUM CAVITY BY TWO-STEP SOLDER REFLOW METHOD

(75) Inventors: Mei-Ling Wu, San Jose, CA (US); Rueyshing Star Huang, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 102 days.

(21) Appl. No.: 12/584,428

(22) Filed: Sep. 4, 2009

(65) Prior Publication Data

US 2011/0059567 A1    Mar. 10, 2011

(51) Int. Cl.
H01L 21/00    (2006.01)
H01L 23/02    (2006.01)

(52) U.S. Cl. ............ 438/118; 438/51; 438/106; 438/48; 438/49; 438/50; 257/E23.193; 257/678; 257/415; 257/414

(58) Field of Classification Search .................. 438/51; 257/678, E23.193

See application file for complete search history.

(56) References Cited

U.S. PATENT DOCUMENTS

| | | | |
|---|---|---|---|
| 6,297,072 B1 * | 10/2001 | Tilmans et al. | 438/106 |
| 6,844,606 B2 | 1/2005 | Logsdon et al. | |
| 6,852,926 B2 | 2/2005 | Ma et al. | |
| 7,259,449 B2 | 8/2007 | Floyd | |
| 7,298,030 B2 | 11/2007 | McWilliams et al. | |
| 7,491,567 B2 | 2/2009 | DCamp et al. | |
| 7,517,712 B2 | 4/2009 | Stark | |
| 2005/0184129 A1 * | 8/2005 | Godijn et al. | 228/56.3 |
| 2007/0000976 A1 * | 1/2007 | Arana et al. | 228/246 |
| 2007/0117275 A1 * | 5/2007 | DCamp et al. | 438/127 |
| 2008/0073768 A1 * | 3/2008 | Shiraishi et al. | 257/684 |

OTHER PUBLICATIONS

"The Indent Reflow Sealing (IRS) Technique—A Method for the Fabrication of Sealed Cavities for MEMS Devices," by Tilmans et al., Journal of Microelectromechanical Systems, vol. 9, No. 2, Jun. 2000, pp. 206-217.
"Wafer-level Hermetic Cavity Packaging," by George A. Riley, Advanced Packaging Magazine, May 2004, 7 pages.
Proceedings European Space Components Conference, ESCCON 2000, SP-439, Jun. 2000, Mar. 21-23, 2000 ESTEC, Noordwijk, The Netherlands, European Space Agency, Hermetically Sealed On-Chip Packaging of MEMS Devices, pp. 67-69.

* cited by examiner

*Primary Examiner* — Ha Tran T Nguyen
*Assistant Examiner* — Aaron Dehne
(74) *Attorney, Agent, or Firm* — Saile Ackerman LLC.; Stephen B. Ackerman; Rosemary L. S. Pike

(57) ABSTRACT

In a method of vacuum packaging a MEMS device, at least one MEMS device is attached on a substrate. A solder preform is printed on the substrate at the perimeter surrounding the substrate. A lid is attached to the solder preform wherein the lid provides a cavity enclosing the at least one MEMS device. A first reflowing step reflows the solder at a first temperature, partially sealing the lid/substrate interface and at the same time does the outgassing and baking procedure for the packaging. Flux is applied onto an outer ring of the solder preform and a second step reflows the solder at a second temperature, completely sealing the lid/substrate interface and providing a vacuum cavity enclosing the at least one MEMS device.

18 Claims, 3 Drawing Sheets

MEMS DEVICE PACKAGE WITH VACUUM CAVITY BY TWO-STEP SOLDER REFLOW METHOD

BACKGROUND OF THE INVENTION (1) Field of the Invention

This invention is related to MEMS devices, and more particularly, to methods of packaging MEMS devices in a vacuum cavity.

(2) Description of the Related Art

Micro-electro-mechanical systems (MEMS), the smallest functional machines that can be manufactured currently, are made up of components ranging from a few micrometers to several millimeters in size. MEMS, a rapidly growing semiconductor field, has many important practical and potential commercial applications. There are a range of commercially available MEMS products including gyroscopes, pressure sensors, fluid regulators, optical switches, displays, mass data storage, biological sensors and chemical controllers, and so on.

A scanning mirror type of MEMS device usually relies on the mechanical oscillation of a suspended microstructure via one or pairs of torsion beams. The structure is electrostatically deflected by energizing at least one actuation electrode in interdigital comb or parallel plate configuration. In order to minimize any air damping or random disturbance during operation, such optical MEMS devices are preferred to be vacuum packaged. Vacuum packaging also provides a benefit of minimizing contamination adsorption.

Device level vacuum packaging involves a complicated package design and sealing process. Commonly, the vacuum package using a lid seal method requires a through hole on the lid, a collapsible sealing gap, or expensive machines having the capability of manipulating assembly parts in a vacuum so the package cavities can be evacuated through the venting hole or the sealing gap or when the parts are not in an intimate contact position. The vacuum sealing is closed by a final solder reflow sealing process. Furthermore, before vacuum seal, the package materials usually require extended hours of bake out at an elevated temperature in order to prevent significant outgassing.

<<Wafer-level hermetic cavity packaging>> by George A. Riley, *Advanced Packaging Magazine*, May 2004, discusses various types of packaging including vacuum packaging for MEMS devices. U.S. Pat. No. 6,297,072 to Tilmans et al discloses a vacuum packaging method for a MEMS device comprising making an indent in a solder ring, forming the vacuum cavity, then reflowing the solder to close the indent and seal the package.

A number of patents discuss MEMS packaging. U.S. Pat. No. 6,852,926 to Ma et al describes a seal ring contacting a bond ring to form a hermetic seal around a MEMS device in a cavity that may contain a vacuum. U.S. Pat. No. 7,491,567 to DCamp et al discloses a solder preform between the MEMS die and the seal ring. The preform is melted and then the package is sealed by soldering. U.S. Pat. No. 6,844,606 to Logsdon et al teaches first reflowing solder to attach a chip to a carrier, then using a solder alloy as a seal ring having a lower reflow temperature than the first solder. U.S. Pat. No. 7,517,712 to Stark shows a solder preform heated to form a solder joint. U.S. Pat. No. 7,298,030 to McWilliams et al describes a sealed chip package using a solder preform. U.S. Pat. No. 7,259,449 to Floyd teaches forming a metal seal, such as solder.

SUMMARY OF THE INVENTION

It is the primary objective of the present invention to package a MEMS device in a vacuum cavity using a two-step solder reflow process.

It is another objective of the invention to package a MEMS device in a vacuum cavity using a two-step solder reflow process where the vacuum achieved is between 0.01 Torr and 10 Torr.

In accordance with the objectives of the invention, a method of vacuum packaging a MEMS device is achieved. At least one MEMS device is attached on a substrate having a solder preform printed on the substrate on a perimeter of the substrate. A lid is attached to the solder preform wherein the lid provides a cavity enclosing the at least one MEMS device. A first reflowing step reflows the solder at a first temperature, partially sealing the lid/substrate interface and causing gassing from the cavity. Flux is applied onto an outer ring of the solder preform and a second step reflows the solder at a second temperature, completely sealing the lid/substrate interface and providing a vacuum cavity enclosing the at least one MEMS device.

DETAILED DESCRIPTION OF THE INVENTION

Using a conventional low cost lid with the lid seal method of the invention, we have demonstrated that a MEMS device can be vacuum sealed to less than 1 Torr by providing a lead-free solder preform, with sufficient width between the substrate and the lid sealing interface and sealing the interface with a two-step sealing process; each with different solder reflow profiles.

The vacuum packaging method of the invention provides significant cost reduction over conventional processes since it eliminates a venting hole on the lid which requires a more complicated lid design, tooling and the final in-vacuum plugging process. It also does away with expensive vacuum manipulation equipment and a separate designated pre-package baking process.

The method of the invention uses a two-step sealing process, each with different solder reflow profiles. The peak temperature at the first sealing step is close to the solder melting temperature, and the reflow profile is programmed to a condition that the interface of the package lid and substrate is mated and bonded but not completely sealed. There are random miniscule leak channels within the sealing interface, so it provides efficient outgas channels and minimizes flux vapor diffused into the package during the second step sealing reflow process. The first step reflow temperature usually is significantly higher than that used in a conventional bake out process; so the short process time is sufficient to achieve the same result as a dedicated pre-package bake out process.

The second step solder reflow process is for final sealing. The reflow profile is optimized to have the solder preform uniformly melt at the interface with sufficient time to cover the interface between the lid and substrate facilitated by applying flux at the outer edge of the solder preform. Applying appropriate flux material at the outer ring of the solder preform can significantly increase the wettability of the solder material at the interface, which makes it possible to use less expensive plating material for the package materials, such as Ni instead of Au. Since the first sealing process creates a somewhat sealed interface, there is a minimal or negligible amount of flux trapped in the package during the second reflow process. Without this two-step reflow sealing, one step reflow sealing without flux cannot achieve vacuum sealing due to the lack of complete solder wetting; one step reflow with flux also cannot achieve vacuum sealing because the sealed cavity has sealed in flux vapors.

Figure 1:
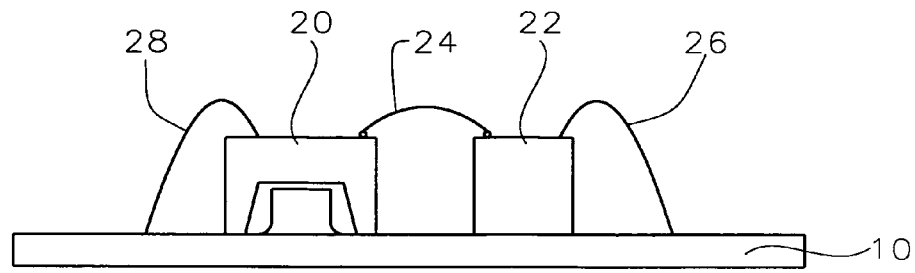
FIG. 1 is a cross-sectional representation of a first step in a preferred embodiment of the packaging process of the present invention.
Figure 2:
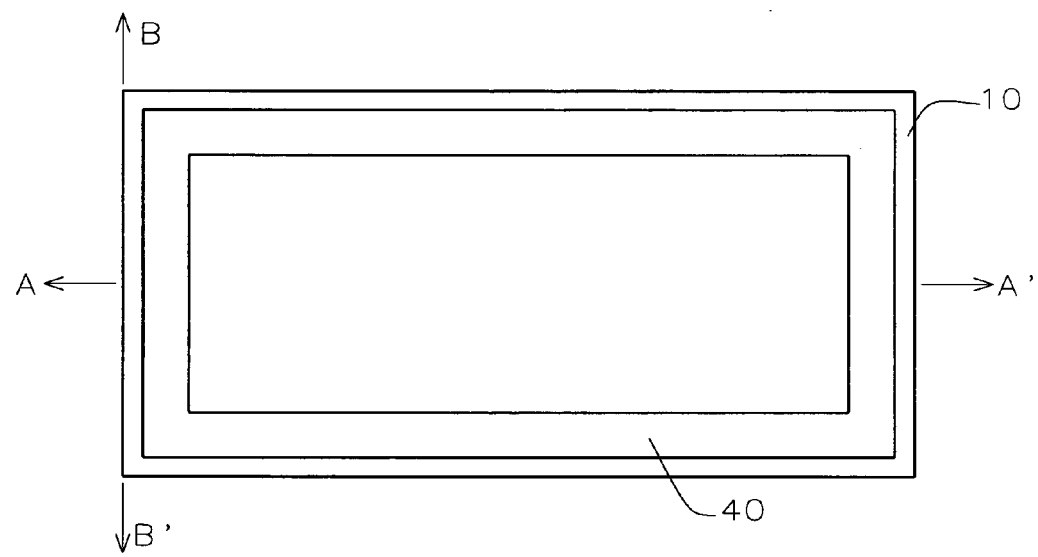
FIG. 2 is a top view of a step in a preferred embodiment of the packaging process of the present invention.
Figure 4:
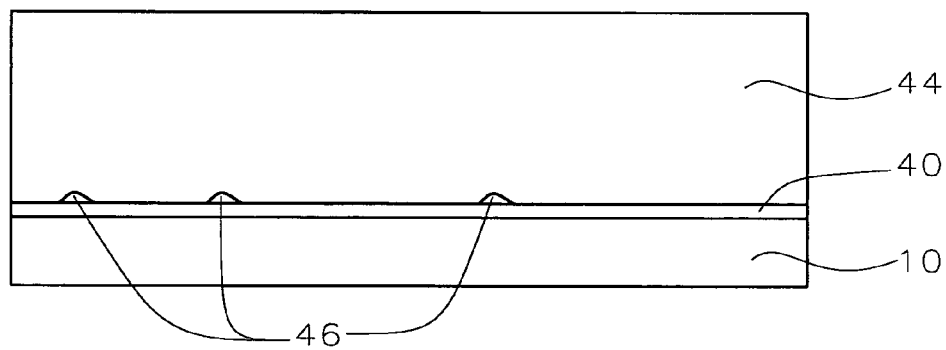
FIG. 4 is a cross-sectional representation of view B-B' of FIG. 2 in a preferred embodiment of the present invention.
Figure 5:
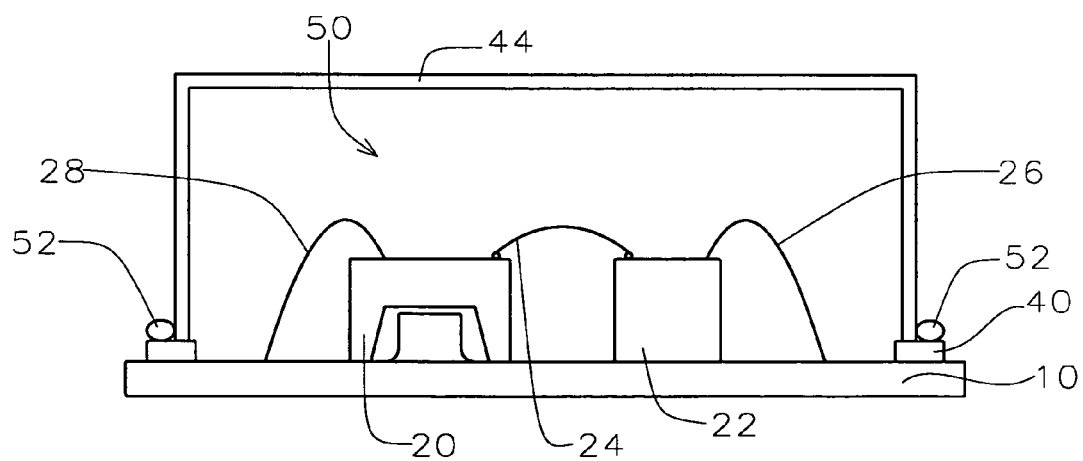
FIG. 5 is a cross-sectional representation of view A-A' of FIG. 2 in a preferred embodiment of the present invention.
Figure 6:
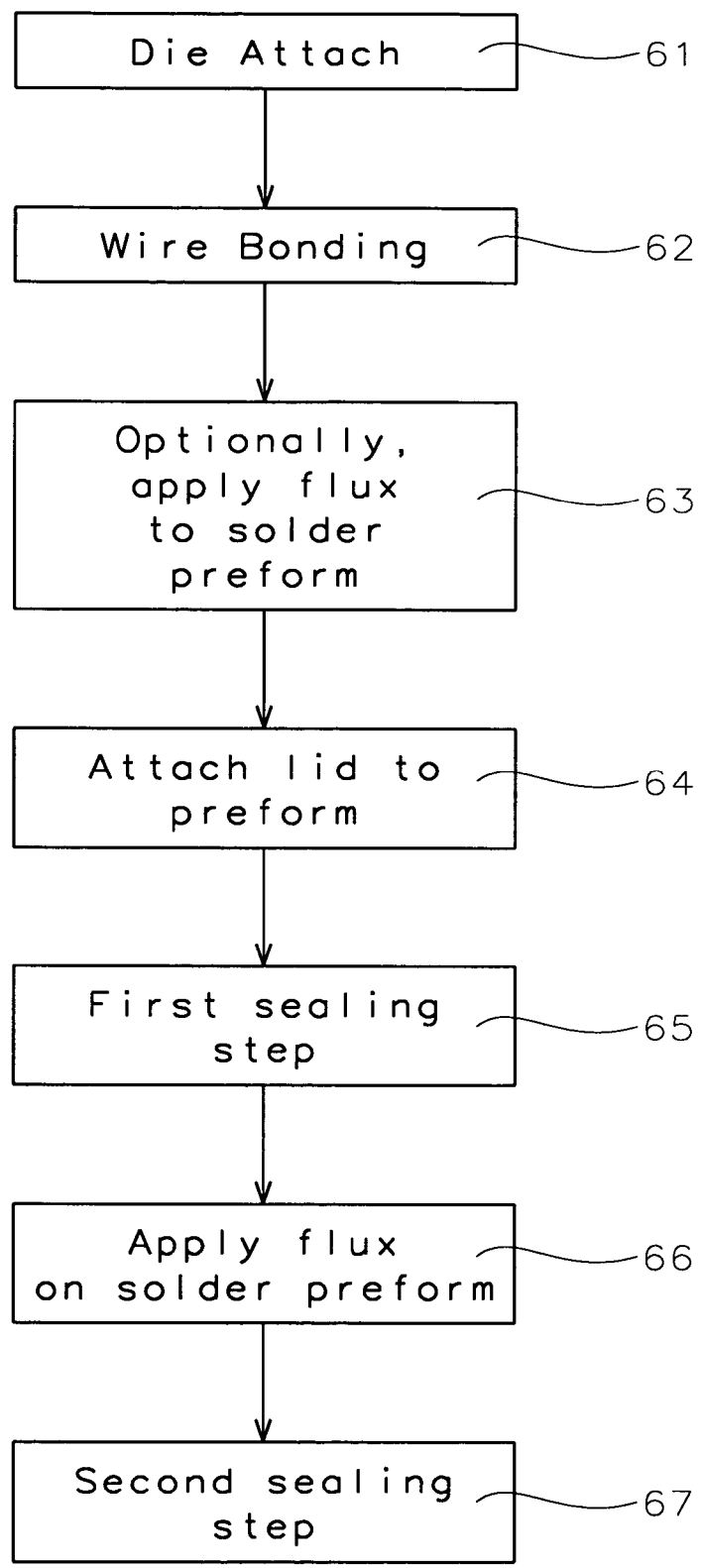
FIG. 6 is a flowchart illustrating steps in a preferred embodiment of the present invention.

The vacuum packaging process of the present invention will be described in detail with reference to the drawing FIGS. 1-6. FIG. 6 is a flowchart illustrating the steps of the vacuum packaging process of the invention. Referring now more particularly to FIG. 1, there is shown a substrate 10. A lead-free solder preform 40 is printed on the substrate 10 surrounding the package at the outer perimeter where the lid rim will sit on to form a seal. This is shown in top view in FIG. 2. The preform 40 is printed using solder paste and then cured. For example, lead free SAC 305 solder may be used having a thickness of a hundred to several hundreds microns. The preform 40 has a sufficient horizontal width of between about 0.8 and 2 millimeters.

Next, devices are attached to the substrate. One MEMS device 20 and one integrated circuit (IC) device 22 are illustrated. It will be understood that the MEMS package of the invention comprises at least one MEMS device, but that more than one MEMS device may be included. One or more electronic components, such as IC 22, typically, an application specific IC (ASIC), may be included in the package. In step 61 of FIG. 6, the at least one MEMS device 20 is attached to the substrate using conventional die attach processes, for example, by using an adhesive. Any IC device 22 is attached to the substrate 10 using an adhesive in a die-attach process, for example. The IC device 22 is then wire-bonded by wires 24 to a bond pad on the MEMS device 20, according to step 62 in FIG. 6. Additionally, wire bonds 28 are formed from the MEMS device to the substrate and wire bonds 26 are formed from the ASIC to the substrate.

In optional step 63, a small amount of flux is applied on the solder preform. The purpose of applying this flux is to help wetting ability and facilitate the reflow of solder. The flux, if applied, must be a small enough amount that it will not result in flux vapor diffusing into the cavity during solder reflow.

Figure 3:
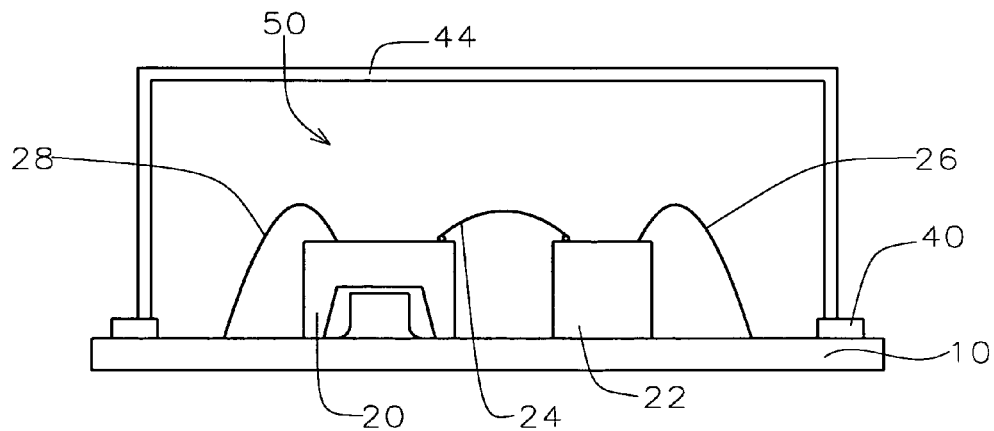
FIG. 3 is a cross-sectional representation of view A-A' of FIG. 2 in a preferred embodiment of the present invention.

A conventional lid 44 is aligned and assembled onto the package substrate 10 using a properly designed fixture, in step 64. The fixture provides the features of down set, aligning pins for parts to sit in, alignment, and clamping. After the parts have been loaded, aligned, and clamped in the fixture, the substrate is loaded into a solder reflow vacuum chamber for first sealing. FIG. 3 illustrates the cross-sectional view A-A' of FIG. 2 after the lid has been attached to the substrate. No venting hole is required within the lid of the invention.

Now, in step 65, a first solder reflow and sealing process is performed. The lid/substrate interface should not be completely sealed during this process in order to provide efficient outgassing through miniscule air leak channels. The peak temperature of this first sealing step is close to the solder melting temperature. The reflow profile is programmed to a condition that the interface of the package lid and substrate is mated and bonded but not completely sealed. The reflow profile used depends on the solder material used and other factors. There are random miniscule leak channels within the sealing interface. Any gas within the cavity 50 enclosed by the lid 44 will be pumped out through the leak channels 46, which are arbitrarily formed along the sealing interface during the solder reflow by vacuum pumping, as illustrated in FIG. 4, showing view B-B' of FIG. 2. The sealing reflow process is performed in a vacuum chamber.

The first step reflow temperature usually is significantly higher than that used in a conventional bake out process; so the short process time is sufficient to achieve the same result as a dedicated pre-package bake out process. Depending on the solder preform used, the time and temperature profile is set suitable for the material and set up for the reflow. The peak temperature is preferred to be close to the solder melting temperature; the time required is between 10 to several 10's minutes.

In step 66, flux is applied on the outer ring of the solder preform. FIG. 5 illustrates flux 52 on the outer ring of the preform 40. Since the first sealing process creates a somewhat sealed interface, there will be minimal or a negligible amount of flux diffused into and trapped in the package during the second reflow process. That is, the miniscule random leakage channels 46 permit only a negligible amount of flux 52 to enter the cavity 50.

The second step solder reflow process is for final sealing, step 67. The lid/substrate interface should be completely sealed under vacuum during this process. The reflow profile is optimized to have the solder preform uniformly melt at the interface with sufficient time to cover the interface between the lid and substrate; that is, the miniscule random leakage channels will be closed by this second sealing process.

A typical reflow profile comprises parameters such as pre-heat, ramp up, soak, and cool down times, and peak temperatures. Optimization of a profile for a particular purpose is achieved by adjusting all these parameters to achieve the best results. Preferably, the reflow profiles for the first and second sealing steps would be different from each other.

The final sealing process is facilitated by the flux 52 applied at the outer edge of the solder preform. Applying appropriate flux material at the outer ring of the solder preform can significantly increase the wettability of the solder material at the interface, which makes it possible to use less expensive plating material such as Ni instead of Au for the lid plating, A one step reflow sealing without flux cannot achieve vacuum sealing due to the lack of complete solder wetting. A one step reflow with flux also cannot achieve vacuum sealing because the sealed cavity has sealed-in flux vapors. The two-step sealing process of the present invention achieves a vacuum level in the range between 0.01 Torr and 10 Torr without sealed-in flux vapors. The vacuum level actually depends on the pumping capability of the reflow chamber vacuum system. In a preferred embodiment, it is less than 1 Torr, but the same method may also work for higher vacuum levels if the system has a higher vacuum pumping capability In the process of the invention, the lid for the package does not require a vent hole or a vent hole plugging final seal process. There is no need for a separate designated pre-vacuum seal bake out process or for a specific designed collapsible gap or gaps in the sealing ring. There is no need to have expensive equipment that can provide capability for manipulating the package parts inside a vacuum. The invention provides a wider selection of plating materials on the package parts, and potentially reduces cost.

Although the preferred embodiment of the present invention has been illustrated, and that form has been described in detail, it will be readily understood by those skilled in the art that various modifications may be made therein without departing from the spirit of the invention or from the scope of the appended claims.

What is claimed is:

1. A method of vacuum packaging comprising:
providing a substrate with a printed solder preform surrounding a perimeter of said substrate, wherein said solder preform has no designed gaps or channels;
attaching at least one MEMS device on said substrate;
attaching a lid to said solder preform wherein said lid provides a cavity enclosing said at least one MEMS device;
first reflowing said solder at a first temperature wherein said first reflowing partially seals the lid/substrate interface and wherein said first reflowing causes outgassing from said cavity;
thereafter applying flux onto an outer ring of said solder preform outside said lid; and
thereafter second reflowing said solder at a second temperature wherein said second reflowing completely seals said lid/substrate interface and wherein said second reflowing provides a vacuum cavity enclosing said at least one MEMS device.

2. The method according to claim 1 further comprising wire bonding said at least one MEMS device to at least one integrated circuit device wherein said at least one integrated circuit device is also enclosed within said cavity.

3. The method according to claim 1 further comprising applying flux to said outer ring of said solder preform prior to said first reflowing step.

4. The method according to claim 1 wherein said first reflowing step and said second reflowing step have different profiles.

5. The method according to claim 1 wherein said solder preform has a horizontal width of between about 0.8 and 2 millimeters.

6. The method according to claim 1 wherein said vacuum is less than 1 Torr.

7. The method according to claim 1 wherein said solder preform is lead-free.

8. The method according to claim 1 wherein said first reflowing step has a peak temperature of close to a melting temperature of said solder.

9. The method according to claim 1 wherein said lid has no vents or holes.

10. The method according to claim 1 wherein said vacuum is between 0.01 Torr and 10 Torr.

11. A method of vacuum packaging a MEMS device comprising:
providing a substrate having a printed solder preform surrounding a perimeter of said substrate wherein said solder preform has no designed gaps or channels;
attaching at least one MEMS device on said substrate;
attaching a lid to said solder preform wherein said lid provides a cavity enclosing said at least one MEMS device;
applying first flux to an outer ring of said solder perform;
thereafter first reflowing said solder at a first temperature wherein said first reflowing partially seals the lid/substrate interface and wherein said first reflowing causes outgassing from said cavity;
thereafter applying flux onto said outer ring of said solder preform outside said lid; and
thereafter second reflowing said solder at a second temperature wherein said second reflowing completely seals said lid/substrate interface and wherein said second reflowing provides a vacuum cavity enclosing said at least one MEMS device.

12. The method according to claim 11 further comprising wire bonding said at least one MEMS device to at least one integrated circuit device wherein said at least one integrated circuit device is also enclosed within said cavity.

13. The method according to claim 11 wherein said first reflowing step and said second reflowing step have different profiles.

14. The method according to claim 11 wherein said solder preform has a horizontal width of between about 0.8 and 2 millimeters.

15. The method according to claim 11 wherein said vacuum is less than 1 Torr.

16. The method according to claim 11 wherein said first reflowing step has a peak temperature of close to a melting temperature of said solder.

17. The method according to claim 11 wherein said vacuum is between 0.01 Torr and 10 Torr.

18. A method of vacuum packaging comprising:
providing a substrate with a printed solder preform surrounding a perimeter of said substrate;
attaching at least one MEMS device on said substrate;
attaching a lid to said solder preform wherein said lid provides a cavity enclosing said at least one MEMS device;
applying first flux to an outer ring of said solder perform;
thereafter, first reflowing said solder at a first temperature wherein said first reflowing partially seals the lid/substrate interface and wherein said first reflowing causes outgassing from said cavity;
thereafter applying second flux onto said outer ring of said solder perform outside said lid and
thereafter second reflowing said solder at a second temperature wherein said second reflowing completely seals said lid/substrate interface and wherein said second reflowing provides a vacuum cavity enclosing said at least one MEMS device.

* * * * *